(12) United States Patent
Lee

(10) Patent No.: US 7,005,033 B2
(45) Date of Patent: Feb. 28, 2006

(54) APPARATUS AND METHOD FOR LAMINATING DRY FILM USING MICROWAVE

(76) Inventor: Kang Lee, 6-1303, Samsung A.P.T., Dongchun-dong, Yeonsu-gu, Incheon (KR) 406-130

( * ) Notice: Subject to any disclaimer, the term of this patent is extended or adjusted under 35 U.S.C. 154(b) by 264 days.

(21) Appl. No.: 10/151,966

(22) Filed: May 22, 2002

(65) Prior Publication Data

US 2003/0178131 A1 Sep. 25, 2003

(30) Foreign Application Priority Data

Mar. 19, 2002 (KR) ................................ 2002-14863

(51) Int. Cl.
*B31B 1/60* (2006.01)
(52) U.S. Cl. ............................... 156/379.8; 156/380.9; 156/381; 156/499; 219/678; 219/385
(58) Field of Classification Search ............. 156/379.6, 156/379.8, 380.9, 381, 499; 219/678, 698, 219/385
See application file for complete search history.

(56) References Cited

U.S. PATENT DOCUMENTS

| | | | |
|---|---|---|---|
| 5,427,842 A | 6/1995 | Bland et al. | |
| 5,779,844 A | * 7/1998 | Lewis et al. | ............. 156/275.5 |
| 6,290,809 B1 | * 9/2001 | Bielfeldt et al. | ......... 156/380.9 |

* cited by examiner

*Primary Examiner*—John T. Haran
(74) *Attorney, Agent, or Firm*—Mayer, Brown, Rowe & Maw LLP

(57) ABSTRACT

The present invention relates to an apparatus and method for laminating a dry film using a microwave which are capable of quickly transforming a photosensitive substance of a dry film to a semi-liquid state by vibrating a water or acryl group copolymer molecular in a dry film for thereby implementing a laminating operation. The apparatus for laminating a dry film includes a microwave oscillating apparatus which includes an interior surrounded by a reflection film, for thereby heat-oscillating a water and acryl group copolymer molecular in a dry film, a caterpillar belt clean apparatus for removing foreign substances formed after pressurizing the film heated by the oscillating apparatus, a frame for performing a laminating work with respect to the substrate fed by the feeding apparatus, and a discharging apparatus for discharging the PCB photosensitive-processed by the microwave oscillating apparatus.

7 Claims, 4 Drawing Sheets

APPARATUS AND METHOD FOR LAMINATING DRY FILM USING MICROWAVE

BACKGROUND OF THE INVENTION

1. Field of the Invention

The present invention relates to an apparatus and method for laminating a dry film using a microwave, and in particular to an apparatus and method for laminating a dry film using a microwave, which are capable of transforming a polymer attached to a dry film to a reaction liquid state using microwave.

2. Description of the Background Art

In the products such as a semiconductor shadow mask and PCB and L/F as well as a flat panel display apparatus, a thin film is laminated on a substrate. In the laminating process, it is important to closely adhere a film and a substrate each other for thereby preventing any foam formation therebetween.

Here, as a method for performing a laminating process, there are known a printing technique and photographing method. The photographing method includes an exposing step and is formed of an ink method which uses a liquid state solution, and a dry film method in which a photosensitive object is slightly coated on a surface of a PET, PE film, etc.

In the ink method, since a solution is fully coated even when a surface of an original film material is rough or has a dent or scratch thereon which may be formed during a fabrication of a highly intensive circuit, the ink method is more preferably used compared to the dry film method which implements a thin coat. However, in the ink method, a worker may be damaged due to the use of a liquid state solvent. If there is an artificially formed through hole on the surface of the same, the ink method may not be used. In addition, the solution may not be uniformly coated, so that a defect occurs during exposure. It is needed to dry for long time after the coating process.

The dry film method may be used without a drying process after the coating process, differently from a liquid state photosensitive substance. In addition, it is possible to implement a uniform thickness. In the case that there is a through hole on the surface, the laminating process can be performed.

Here, the laminating process is formed of a rolling work in which heat is applied to a roller, and the film is pressurized by the roller. In the rolling work, a film is prepared on a glass substrate, and then the roller uniformly rolls on the film, so that the film is effectively attached on the substrate by a pressurizing force.

In the attaching step based on the rolling operation, the roller directly contacts with the film for thereby uniformly applying a pressurizing force to the whole surfaces of the film, and it is needed to transfer heat to the surfaces of the film.

In the conventional close-attaching method, the laminating process is performed in such a manner that a destination object is electricity-alkali-processed, the surface of the destination object is brushed, and the destination object is acid-rinsed and dried. The closely contacting method based on the heat pressurizing operation is implemented using a heat-IR (Infrared Ray) method. At this time, since the IR has a bandwidth similar to the UV bandwidth which is an exposing bandwidth of a dry film, the photosensitive operation is concurrently performed based on the temperature. Therefore, the boundary ranges of the temperatures are important.

FIG. 1 is a cross-sectional view illustrating a conventional laminating apparatus in which a heating apparatus is engaged to a frame roller. As shown in FIG. 1, in a conventional laminating apparatus 100, a film is inputted from a film roll into a roller 118 having a heater, and then a dry film is pressurized and attached to a destination object. However, in the heating apparatus 118, a heat may not be uniformly transferred to the film due to an inherent characteristic of a photosensitive material and a characteristic such as a weight of a roller, etc. In addition, when a scratch, dent, roughness, etc. occur on the surface of a destination material film, even when a good coating is performed, an attaching force and filled-up state may have a certain defect.

SUMMARY OF THE INVENTION

Accordingly, it is an object of the present invention to provide an apparatus and method for laminating a dry film using a microwave which overcome the problems encountered in the conventional art.

It is another object of the present invention to provide an apparatus and method for laminating a dry film using a microwave which are capable of quickly transforming a photosensitive substance of a dry film to a semi-solution state for thereby implementing an excellent laminating operation by vibrating a water or acryl group copolymer molecular of a dry film using microwave. The above inventive technology was found while studying a uniform pressure applying method in which a certain liquid state effect is obtained even when a defect lines in the front surface of a film when laminating a thin film.

To achieve the above objects, there is provided an apparatus for laminating a dry film using a microwave, which includes a microwave oscillating apparatus having an interior which is surrounded by a reflection film for heating a dry film, a feeding apparatus for feeding a dry film heated by the oscillating apparatus, a frame for performing a laminating work with respect to a substrate fed by the feeding apparatus, and a discharging apparatus for discharging film liquefied by the microwave oscillating apparatus.

To achieve the above objects, there is provided a method for laminating a dry film using a microwave, which includes a step in which a dry film is pressurized on a surface in which a circuit of a printed circuit board is formed for thereby forming an adhesion layer, a step in which light from the microwave oscillating apparatus is applied to the adhesion layer for thereby heating the same, a step in which a foreign substance generated after the adhesion layer is adhered in the microwave applying step is passed through a liquid box and is brushed, and a step in which a polymer liquid on the caterpillar is dried in a hot air blower box.

To achieve the above objects, there is provided a method for laminating a dry film using a microwave, which includes a step in which is a printed circuit board is inputted, a step in which the printed circuit board is heated by oscillating a dry film using microwave, a step in which the printed circuit board and the dry film are first adhered by a pressurizing roller, a step in which the microwave is applied gain for thereby heating, and a step in which the printed circuit board and the dry film are second adhered by another pressurizing roller.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

The preferred embodiments of the present invention will be explained with reference to the accompanying drawings.

Figure 2:
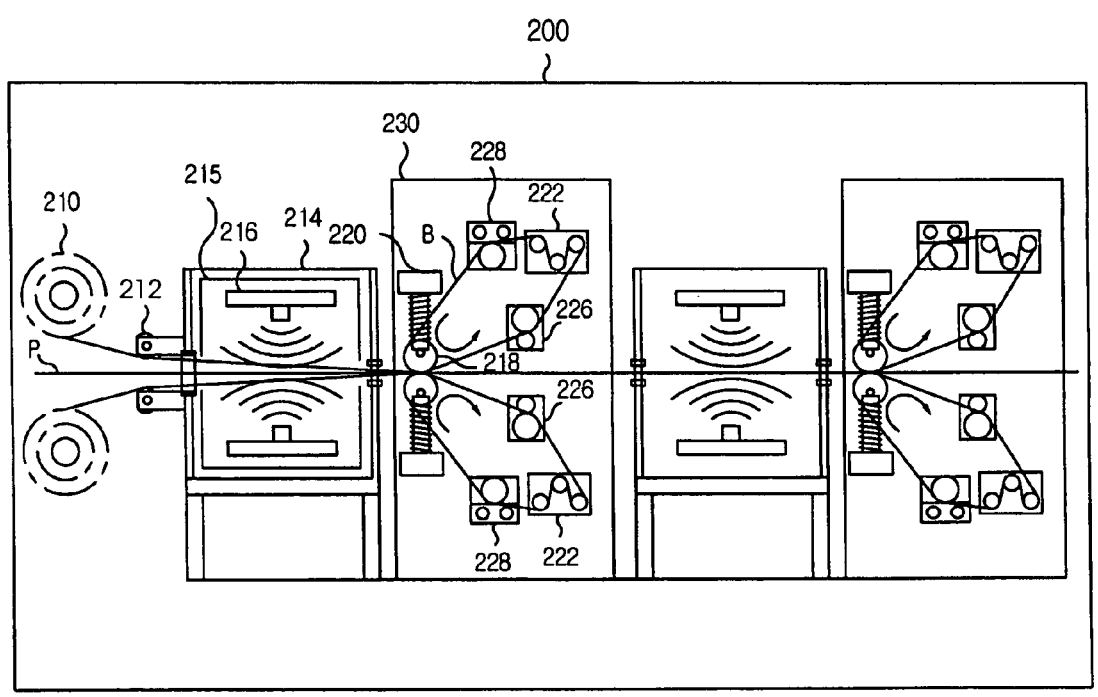
FIG. 2 is a plan view for explaining an operation of a laminating apparatus according to an embodiment of the present invention.

FIG. 2 is a plan view for describing a laminating apparatus according to an embodiment of the present invention. In the drawings, the elements having the same construction and function are given the same numeral references.

As shown in FIG. 2, the laminating apparatus may be classified into a pre-processing region and an after-processing region. In the pre-processing region, a film to be laminated is arranged on a frame. In the after-processing region, the film is arranged in the same manner as the pre-processing region for thereby implementing a double process. The constructions and operation of the apparatus of the pre-processing region will be described. In the after-processing region of the laminating, a single or double process may be implemented in the same manner as the pre-processing region.

As shown in FIG. 2, the laminating apparatus 200 includes a substrate P which is provided together with a dry film from a film roll 210, a feeding apparatus having a tension roller 212 for feeding a PCB (Printed Circuit Board), a microwave oscillation apparatus 214 for heating and oscillating a dry film, a feeding roller 218 in which a source engaging apparatus 216 is fixed in the interior of the oscillating apparatus 214, for thereby feeding the substrate heated by the source engaging apparatus 216, and a frame 230 for performing a laminating work with respect to the substrate fed by the roller 218.

In the microwave oscillating apparatus, the film roll 210 is connected to the entrance portion of the same. In the dry film roll 210, a solid state photosensitive substance is attached to the PE film in a thin form. The dry film has a certain tension force by the tension roller 212 which adjusts the tension force and height of the dry film fed from the film roll 210. In addition, the interior of the microwave oscillating apparatus is surrounded by a blocking and reflection film 215, and the microwave oscillating apparatus oscillates 500~3000 MHz wavelength. Preferably, the microwave oscillating apparatus oscillates 910~920 MHz wavelength or 2440~2460 MHz wavelength. More preferably, the microwave oscillating apparatus oscillates 915 or 2450 MHz wavelength. In addition, the oscillating apparatus guides a molecular vibration of water and acryl group polymer and transforms a solid state film to a semi-liquid state material. Here, since the polymer group component and water molecular have different vibration bandwidths, both vibration bandwidths may be used or only water molecular vibration bandwidth may be used.

Figure 1:
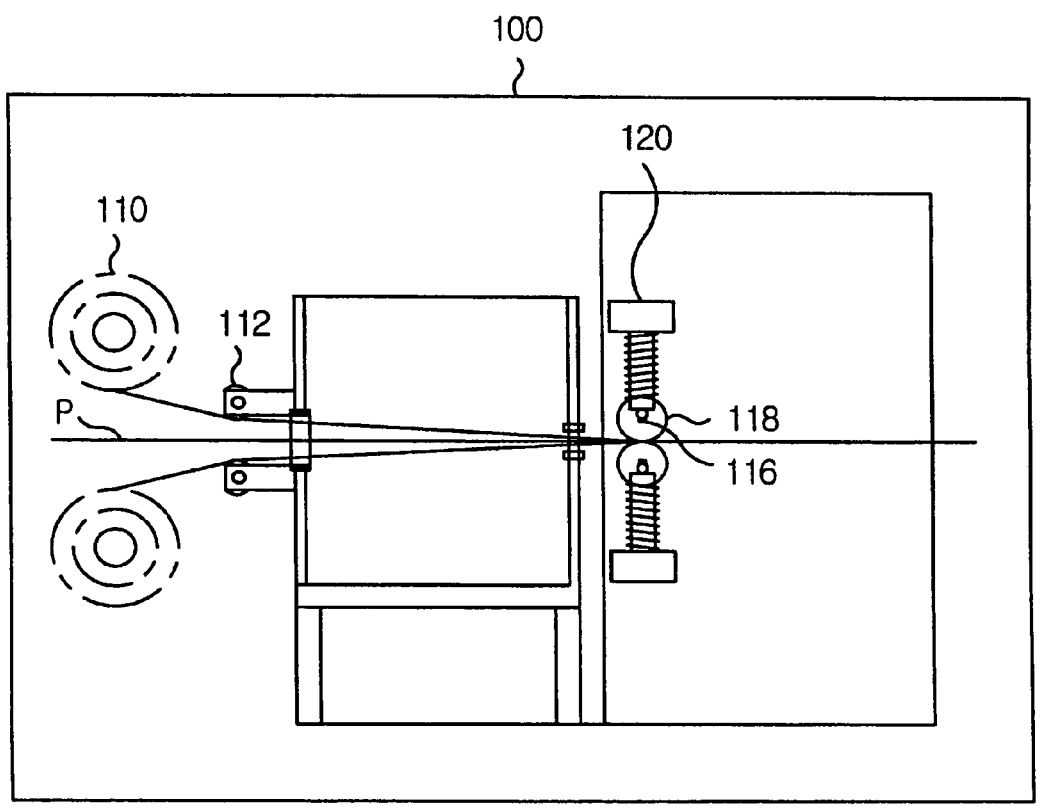
FIG. 1 is a plan view illustrating a conventional laminating apparatus.

The water molecular has 91 MHz or 2450 MHz oscillation bandwidth. The oscillating apparatus 216 liquefies the dry film instead of the heating apparatus 118 of FIG. 1.

In the frame 230, a dry film roll 218, an oil-hydraulic or pneumatic cylinder 220, an adhesion roller box 226 having an adhesion roll, a liquid clean and brush roller box 222 and a hot air blower box 228 are integrally engaged. The frame 230 operates by an auxiliary caterpillar belt (B) based on the operation of a control unit (not shown). Here, the dry film pressure roller 218 pressurizes a semi-liquid state dry film on a destination film using a pressure of the air-hydraulic or pneumatic cylinder 220. The air-hydraulic or pneumatic cylinder 220 adjusts the dry film pressure roller 218 in the vertical direction with respect to the pressure. The air-hydraulic or pneumatic cylinder 220 is connected with a motor (not shown) for thereby maintaining a horizontal/vertical state of the film pressure roller 218, the liquid clean and brush roller box 222.

In addition, in the frame 230, the adhesive roller box 226, the liquid clean and brush roller box 222 which brushes in the liquid and cleans the caterpillar belt, and the hot air blower box 228 are engaged in the caterpillar belt. The microwave oscillating apparatus is coupled to the frame 230 by bolts. Here, the auxiliary caterpillar belt (B) transfers foreign substances through the liquid clean and brush roller box 222 having a strong adhesive force. The liquid clean and brush roller box 222 dissolves an acryl group copolymer based on a double operation in the case that a small amount of foreign substances remains after the transfer of the same. In addition, a certain solution such as NaOH, $Na_2Co_3$, etc. is filled in the liquid clean and brush roller box 222, and a brush is provided in a solution of NaOH and $Na_2Co_3$. A hot air is supplied to the hot air blower box 228. The hot air blower box 228 is designed to stand a PE, PP group related acid or alkali component.

The operation of the present invention will be explained. The microwave oscillating apparatus of the laminating apparatus 200 is implemented based on the operation of the timing of the timer of the control unit (not shown). The foreign substances attached on the destination object after the laminating and pressuring operations are removed by the adhesion roller 226. The laminating apparatus 200 applies microwaves to the dry film unrolled from the film roll 210. At this time, the working condition is controlled by the tension roller 212. The tension roller 212 is adjustable based on a set data value of the control unit. Whenever the photosensitive substance which is a photosensitive material of the dry film is transformed to a liquid state (semi-liquid state) by the microwave, the gel state dry film is attached on a Printed Circuit Board (PCB, L/F, etc.) based on the speed and time of the laminating roll. In addition, the microwave uses a vibration frequency bandwidth of a water molecular and a vibration possible frequency bandwidth of an acryl group copolymer. In addition, as the condition of the dry film is changed, a certain characteristic bandwidth frequency may be used.

Figure 3:
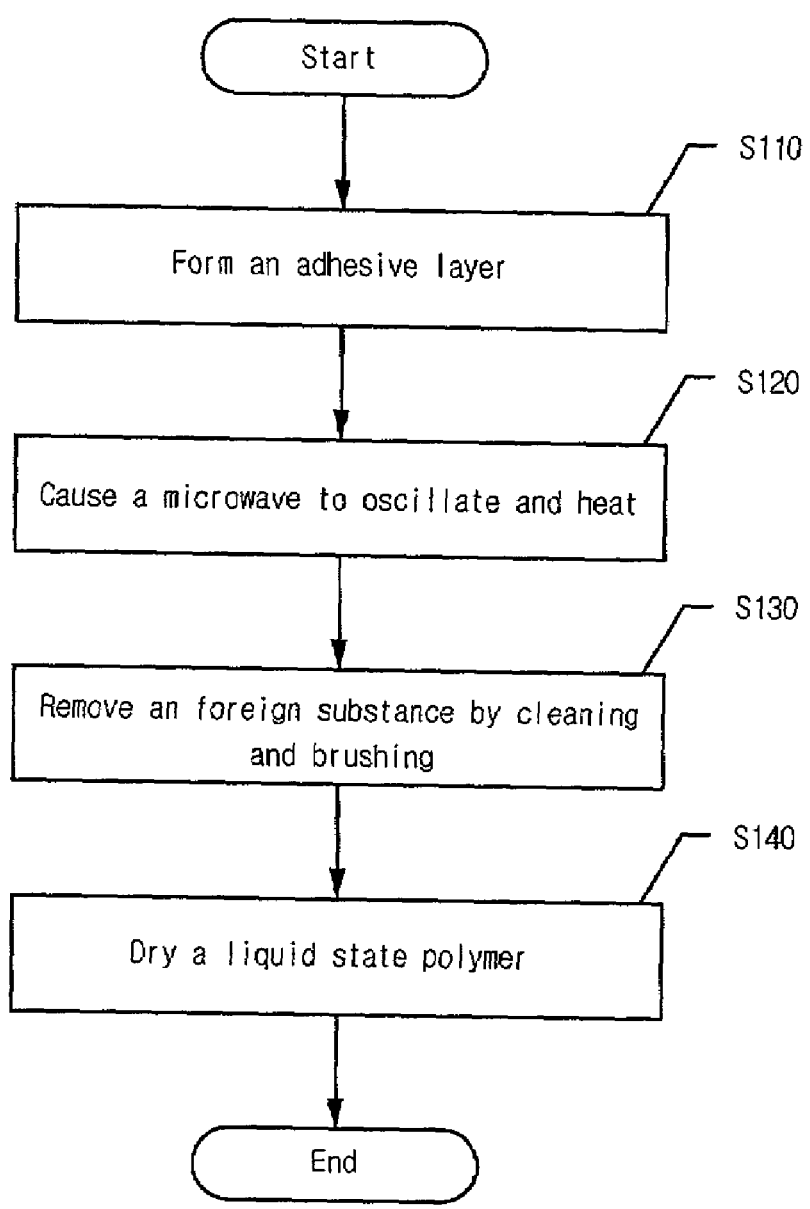
FIG. 3 is a flow chart of a laminating method according to an embodiment of the present invention.

The method for laminating a dry film according to a first embodiment of the present invention will be described with reference to FIGS. 3 and 4. FIG. 3 is a flow chart of a method for laminating a dry film according to the present invention.

In a Step S110, a dry film is pressurized on a circuit formed surface of a printed circuit board. In a Step S120, a microwave oscillating apparatus oscillates a certain wavelength to an adhesive layer. In a Step S130, after the adhesive layer is pressurized, the foreign substances are removed by a cleaning and brushing operation through the adhesion roller box and the liquid clean and brush roller box 222 using a caterpillar belt for processing an externally leaking liquid state polymer. In a Step S140, the liquid state polymer of the caterpillar B is dried by the hot air blower box 228.

Figure 4:
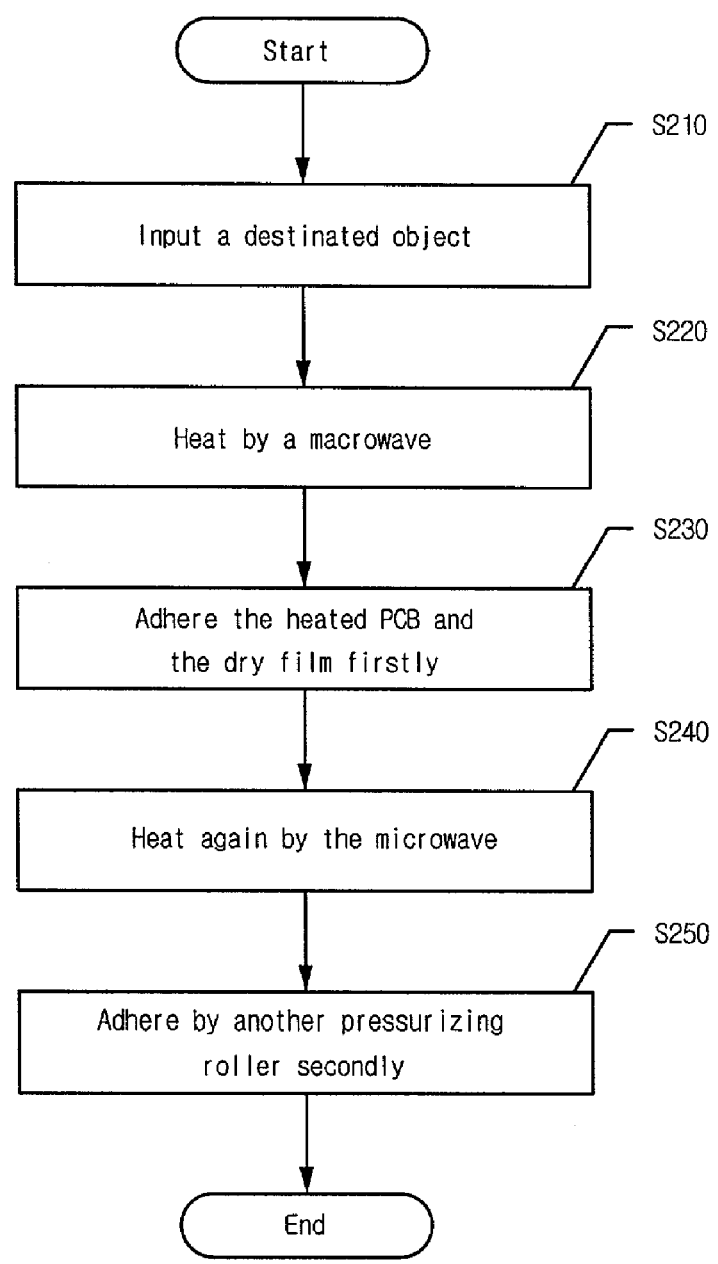
FIG. 4 is a flow chart of a laminating method according to another embodiment of the present invention.

FIG. 4 is a flow chart of a method for laminating a dry film according to a second embodiment of the present invention.

In particular, FIG. 4 illustrates a process for alkali-processing and laminating a destination object. Since the above first embodiment of the present invention includes the construction and microwave wavelength same as that of the first embodiment of the present invention, the detailed descriptions of the same are omitted. However, the after-process region is implemented based on the following process differently from the process with respect to the pre-process region of FIG. 3. In a Step S210, in the laminating process, a certain material such as a printed circuit board (PCB) or L/F which is a destination object and indicated by a character P is inputted. In a Step S220, the inputted printed circuit board is heated by the microwave based on the dry film oscillation. In a Step S230, the heated P and dry film are first adhered by the pressurizing roller 218 of FIG. 2. In a Step S240, the dry film is applied with the microwave again and is heated. In a Step S250, the dry film is second adhered by another pressurizing roller.

In addition, in the laminating process, the steps to the adhering step S230 or the second adhering step S250 may be performed separately.

Accordingly, in the present invention, when the dry film is laminated using a microwave of the laminating apparatus, since the dry film which will be laminated, is already liquefied, the conventional roller having a heater therein is not needed. In addition, it is possible to coat a thin photosensitive substance on a dry film without foams between the substrate and the film, so that it is possible to attach a film based on a thinner dry film. In addition, the work with respect to the through hole which is not implemented in the liquid state is implemented in the present invention. The drying process is not needed. Therefore, the effects related to the liquid state and the inherent effects of the film are both obtained. Since the preprocessing period is significantly decreased, the productivity is increased, and the fixed facility investment is decreased, and it is possible to implement an accurate product delivery and a product quality. The error ratio of the products is significantly decreased based on the better other processed which are performed after the laminating process, so that the work stability is obtained for thereby enhancing the quality of the devices such as finished PCB.

As the present invention may be embodied in several forms without departing from the spirit or essential characteristics thereof, it should also be understood that the above-described examples are not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A laminating apparatus for laminating a dry film and a substrate, the laminating apparatus comprising:
   a microwave oscillating apparatus having an interior which is surrounded by a reflection film for heating the dry film;
   a feeding apparatus for feeding the substrate and the dry film together;
   a pressure roller for laminating the substrate and the dry film, and discharging excess liguid from the dry film liquefied by the microwave oscillating apparatus.

2. The laminating apparatus of claim 1, wherein the microwave oscillating apparatus includes an entrance connected with a dry film roll, and a solid state photosensitive substance is attached to a PE film in a thin form in the dry film roll.

3. The laminating apparatus of claim 1, wherein the microwave oscillating apparatus oscillates at a 500~3000 MHz wavelength.

4. The laminating apparatus of claim 1, wherein the microwave oscillating apparatus oscillates at a 910~920 MHz wavelength.

5. The laminating apparatus of claim 1, wherein the microwave oscillating apparatus oscillates at a 2440~2460 MHz wavelength.

6. The laminating apparatus of claim 1, wherein the laminating apparatus includes a liquid clean and brush roller box for dissolving an acryl copolymer-collected from the dry film and carried to the liquid clean and brush roller box by a caterpillar belt.

7. The laminating apparatus of claim 1, wherein the pressure roller is operated based on a caterpillar belt in such a manner that an adhesion roller, a liquid clean and brush roller box, and a hot air blower box are integrally engaged by the caterpillar belt to the pressure roller.

* * * * *